(12) United States Patent
Shibuya et al.

(10) Patent No.: US 7,196,413 B2
(45) Date of Patent: Mar. 27, 2007

(54) HEAT DISSIPATION ASSEMBLY AND METHOD FOR PRODUCING THE SAME

(75) Inventors: Akihiro Shibuya, Zama (JP); Motoyuki Furukawa, Tokyo (JP); Mikio Naruse, Isehara (JP); Atsushi Ehira, Hiratsuka (JP); Kazuhiro Ogawa, Yokohama (JP); Hirotoshi Oota, Nishikamo-gun (JP); Kazuyoshi Abe, Nishikamo-gun (JP); Atsushi Ikezawa, Minamiashigara (JP); Toru Kakehi, Ashigarakami-gun (JP)

(73) Assignees: Nissan Motor Co., Ltd., Kanagawa-Ken (JP); Fuji Polymer Industries Co., Ltd., Aichi-Ken (JP); Dow Corning Toray Co., Ltd., Tokyo (JP)

( * ) Notice: Subject to any disclaimer, the term of this patent is extended or adjusted under 35 U.S.C. 154(b) by 0 days.

(21) Appl. No.: 11/069,293

(22) Filed: Mar. 1, 2005

(65) Prior Publication Data
US 2005/0205989 A1    Sep. 22, 2005

(30) Foreign Application Priority Data
Mar. 3, 2004    (JP) .............................. 2004-059140

(51) Int. Cl.
*H01L 23/10* (2006.01)
*H01L 23/34* (2006.01)

(52) U.S. Cl. ...................................... 257/707; 257/706
(58) Field of Classification Search ................ 257/706, 257/707, 712, 713, 719, 782, 783
See application file for complete search history.

(56) References Cited

U.S. PATENT DOCUMENTS

| | | | | |
|---|---|---|---|---|
| 4,962,416 | A | * 10/1990 | Jones et al. | ................. 257/722 |
| 5,170,930 | A | * 12/1992 | Dolbear et al. | .......... 228/123.1 |
| 6,706,562 | B2 | * 3/2004 | Mahajan et al. | ............ 438/125 |
| 6,787,899 | B2 | * 9/2004 | Rinella et al. | .............. 257/712 |

FOREIGN PATENT DOCUMENTS

JP        11-135691        5/1999

\* cited by examiner

*Primary Examiner*—S. V. Clark
(74) *Attorney, Agent, or Firm*—Kenyon & Kenyon LLP

(57) ABSTRACT

A heat dissipation assembly in which a heat generator and a heat dissipator are integrated via an electrically insulating and thermally conductive sheet, at least one surface of which a thermally conductive grease is applied to, in which the thermally conductive grease is incompatible with the electrically insulating and thermally conductive sheet. Heat from the heat generator such as a semiconductor device or the like can be effectively dissipated while an electrically insulating condition is maintained over a long period of time.

10 Claims, 10 Drawing Sheets

FILLING PARTICLES OF THE SAME PARTICLE SIZE AT A LOW RATE

FILLING PARTICLES OF THE SAME PARTICLE SIZE AT A HIGH RATE

MIXING TWO KINDS OF PARTICLES OF DIFFERENT PARTICLE SIZES

FIG.6
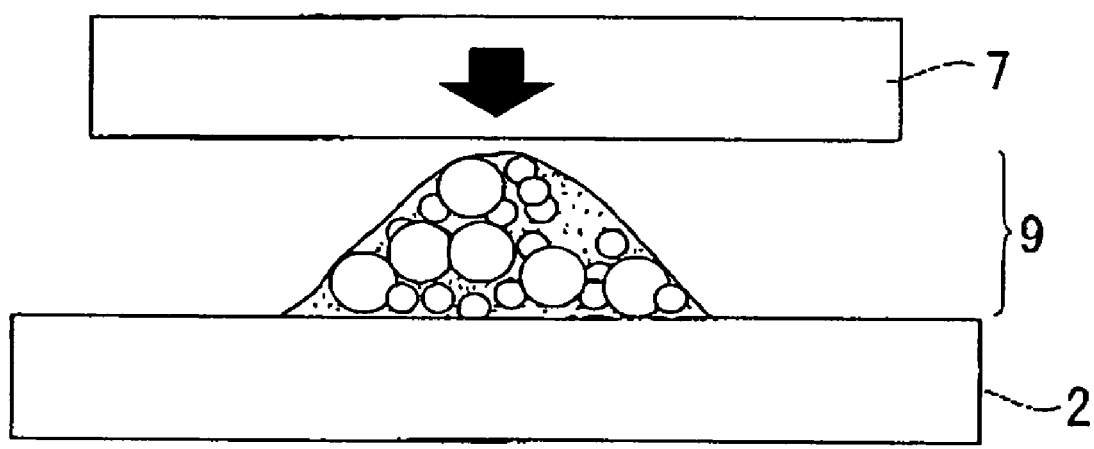
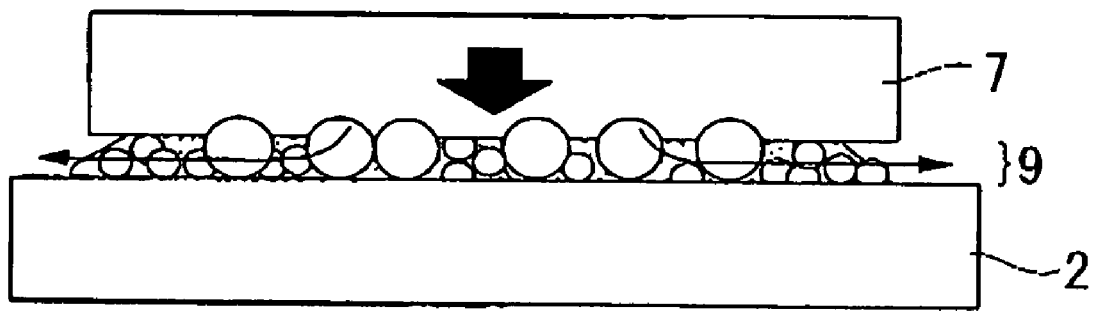

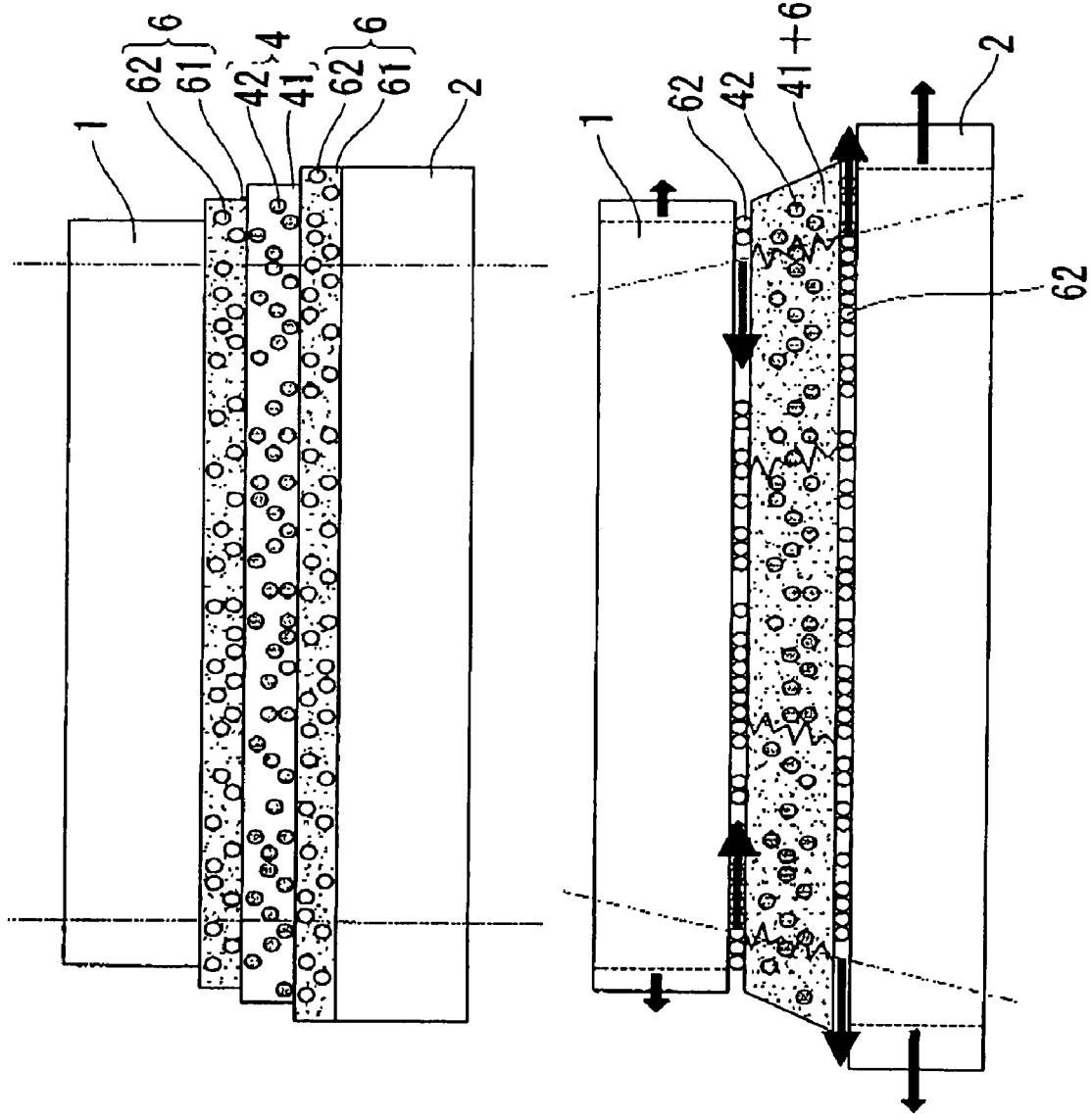

HEAT DISSIPATION ASSEMBLY AND METHOD FOR PRODUCING THE SAME

RELATED APPLICATIONS

This application claims the benefit of Japanese Patent Application No. 2004-059140 filed on Mar. 3, 2004, the contents of which are herein incorporated by reference in their entirety.

BACKGROUND OF THE INVENTION

1. Field of the Invention

The present invention relates to a heat dissipation assembly and a method for producing the same. In particular, the present invention relates to a heat dissipation assembly and a method for producing the same, in which heat from a heat generator such as a semiconductor device or the like is effectively dissipated while an electrically insulating condition is maintained, and superior durability for usage for a long period of time is exhibited.

2. Description of Related Art

Heretofore, various heat dissipation assemblies for cooling a heat generator such as a semiconductor device or the like have been proposed. FIG. 7 and FIG. 8 show one embodiment of a conventional heat dissipation assembly in a semiconductor device. In FIG. 7 and FIG. 8, a bonding wire for power distribution and a sealing resin are not shown.

In the heat dissipation assembly shown in FIG. 7, semiconductor elements 11 are fixed to a resin molding part 13 of a semiconductor device 1, together with electrode plates 12. As shown in FIG. 8, the electrode plates 12 of the semiconductor elements 11 are exposed at the surface of the resin molding part 13. To the molding part 13, holes 14 for fixing are formed, and the molding part 13 is fixed to a heat sink 2 made of metal by means of fixing screws 3 inserted in the holes 14. Inside of the metallic heat sink 2, coolant passages 5 are formed, and a coolant for heat dissipation circulates in the coolant passages.

Between the resin molding part 13 and the metallic heat sink 2, a sheet 4 having insulating and heat dissipating effects is interposed, and thereby, the electrode plates 12 on the surface of the resin molding part 13 are electrically insulated from the metallic heat sink 2. In addition, the sheet 4 is integrated with the metallic heat sink 2 and the resin molding part 13 of the semiconductor device 1 by means of fixing screws 3. For this reason, heat generated in the semiconductor element 11 is dissipated via the electrode plate 12 to the sheet 4, then to the metallic heat sink 2, and then to the coolant passage 5.

As the sheet 4, in general, an electrically insulating/thermally conductive sheet which is formed from a base material having an electrically insulating property such as a silicone rubber or the like, and a thermally conductive filler, and which exhibits both functions of electrically insulating properties and thermally conductive properties is employed.

In the heat dissipation assembly shown in FIG. 7 and FIG. 8, in order to improve cooling efficiency by reducing thermal resistance of the sheet 4, it is believed that, for example, a charging ratio of the thermally conductive filler in the sheet 4 may be increased or that a contacting ratio between the surface of the sheet 4 and the surfaces having microirregularities of the metallic heat sink 2 and the semiconductor device 1 (electrode plates 12) may be improved by increasing flexibility of the sheet 4.

However, the two methods for reducing thermal resistance described above are in an incompatible relationship. For this reason, reducing thermal resistance due to making the sheet 4 flexible is limited. Therefore, as described in Japanese Unexamined Patent Application, First Publication No. H11-135691, it is proposed that an electrically insulating/thermally conductive grease 6 produced by mixing a base material having electrically insulating properties such as a silicone oil and the like, with a thermally conductive filler, is applied to the surface of the sheet 4. FIG. 9 is an enlarged view showing the contacting condition of the sheet 4 with the metallic heat sink 2 and with the electrode plate 12 in the case of applying the grease 6 to both surfaces of the sheet 4. As shown in FIG. 9, even if flexibility of the sheet 4 is not sufficient, and it is impossible to sufficiently follow the microirregularities on the surfaces of the metallic heat sink 2 and the electrode plates 12, the grease 6 is charged in the microgap between the contacting surfaces of the sheet 4 and of the electrode plates 12 and the metallic heat sink 2, and for this reason, thermal resistance can be reduced.

According to Japanese Unexamined Patent Application, First Publication No. H11-135691, as shown in FIG. 9, it is mentioned that the sheet 4 in which the grease 6 is applied to the surfaces of the sheet can be used for a long period of time under the thermal conditions during operation of the semiconductor element. However, in practice, when the sheet 4 in which the grease 6 is applied to the surfaces thereof is used for a long period of time under increased temperatures such as the temperatures during operating the semiconductor elements, the grease 6 is denatured and is solidified, and the sheet 4 may lose elasticity, and finally, the electrically insulating properties of the sheet 4 are lost. Therefore, there is a problem in that insulating defects of the semiconductor device 1 (electrode plates 12) occur.

The mechanism of occurrences of insulating defects is described by way of FIG. 10. In a heat dissipation assembly shown in FIG. 10 in which a sheet 4 in which a grease 6 is applied to the both surfaces thereof is provided between a semiconductor device 1 and a metallic heat sink 2, the grease 6 comprises a dimethylpolysiloxane-based silicone oil base material 61 and a thermally conductive filler 62, and the sheet 4 comprises a dimethylpolysiloxane-based silicone rubber base material 41 and a thermally conductive filler 42. The sheet 4 and the grease 6 respectively exhibit superior thermal resistance. By employing a combination of these, the heat dissipation assembly shown in FIG. 10A and FIG. 10B can have superior insulating properties and heat dissipation properties under the initial conditions shown in FIG. 10A.

However, in the heat dissipation assembly shown in the drawing, the base material of the sheet 4 and the base material of the grease 6 are dimethylpolysiloxane-based materials, and they have similar chemical structures. Therefore, as shown in FIG. 10B, during use for a long period of time, the components of the dimethylpolysiloxane-based silicone oil base material 61 in the grease 6 penetrate into the sheet 4, and thereby, the sheet 4 swells, and strength, elongation properties, and the like, are deteriorated. In addition, in the grease 6 on the surface of the sheet 4, the thermally conductive filler 62 which is a solid component remains at a high rate. As a result, almost all the grease 6 is occupied by the filler 62, and therefore, the grease 6 becomes solid.

By solidifying the grease 6, the sheet 4 is fixed to the semiconductor device 1 and the heat sink 2 made of metal. However, when under the condition described above, operations of the semiconductor element of the semiconductor device 1 are repealed, since the thermal expansion coefficient of the semiconductor device 1 is different from that of the heat sink 2 made of metal, different displacements are exerted on the both surfaces of the sheet 4 in the heat cycle of the high temperature condition during operation and the low temperature condition during stopping the operation, thereby generating a force which tears the sheet 4. The heat cycle described above may occur due to not only repeated operations of the semiconductor element, but also due to setting conditions of the semiconductor device (such as in automobiles) Tf the occurrence of the tearing force is repeated during use over a long time, cracking occurs at a part of the sheet 4. As a result, between the semiconductor device 1 and the metallic heat sink 2, insulating defects occur.

FIG. 10 shows an embodiment in which the grease 6 is applied to both surfaces of the sheet 4. The problems of insulating defects described above also occur in the same manner as described above, in the case of applying the grease 6 to one of the surfaces of the sheet 4.

SUMMARY OF THE INVENTION

The present invention has as an object to solve the problems described above. More particularly, the present invention has as an object to provide a heat dissipation assembly which can effectively dissipate heat from a heat generator such as a semiconductor device or the like, while electrically insulating properties are maintained for a long period of time.

The heat dissipation assembly of the present invention is a heat dissipation assembly in which a heat generator and a heat dissipator are integrated via an electrically insulating and thermally conductive sheet, wherein between the aforementioned electrically insulating and thermally conductive sheet and the aforementioned heat generator, and/or between the aforementioned electrically insulating and thermally conductive sheet and the aforementioned heat dissipator, a thermally conductive grease layer formed from a thermally conductive grease which is incompatible with the aforementioned electrically insulating and thermally conductive sheet is provided.

In the case in which the thermally conductive grease described above comprises a perfluoropolyether-based composition, a $C_6$–$C_{20}$ alkyl-modified silicone-based composition, or a fluorinated alkyl-modified silicone-based composition, the electrically insulating and thermally conductive sheet preferably comprises a methylvinylsilicone-based rubber such as methyl vinyl polysiloxane silicone rubber.

On the other hand, in the case in which the thermally conductive grease described above comprises a dimethylsilicone-based composition, a perfluoropolyether-based composition, a $C_6$–$C_{20}$ alkyl-modified silicone-based composition, or a methylphenylsilicone-based composition, the electrically insulating and thermally conductive sheet described above preferably comprises a fluorosilicone-based rubber such as methyl vinyl trifluoropropyl polysiloxane silicone rubber.

The thermally conductive property of the thermally conductive grease described above is mainly provided by the thermally conductive filler described above contained in the grease described above. The thermally conductive filler may be a mixture of fillers having different particle sizes.

The heat dissipation assembly can be produced by a method including:

applying a thermally conductive grease to at least one of at least one surface of an electrically insulating and thermally conductive sheet, a surface of a heat generator and a surface of a heat dissipator;

first press-bonding the aforementioned surface of one of the heat generator and the heat dissipator to the surface of the aforementioned electrically insulating and thermally conductive sheet; and second press-bonding the aforementioned surface of another one of the heat generator and the heat dissipator to the surface of the aforementioned electrically insulating and thermally conductive sheet which is different from the surface mentioned in the first press-bonding;

the aforementioned electrically insulating and thermally conductive sheet being incompatible with the aforementioned thermally conductive grease.

In the application of the thermally conductive grease described above, the thermally conductive grease may be applied to both surfaces of the electrically insulating and thermally conductive sheet and/or to the surface of the heat generator and the heat dissipator. In addition, the thermally conductive grease may be subjected to a spot supply application. Here, the term "spot supply application" indicates that an application object is point-like applied on the surface of the subject to be applied, and the object is not applied to the entire subject face to be applied. The subject to be applied can be mounted on the application face as at least one spot (dot).

The two press-bonding steps can be successively carried out. Preferably, they are carried out simultaneously.

In the case in which the thermally conductive grease employed in the producing method described above comprises a perfluoropolyether-based composition, a $C_6$–$C_{20}$ alkyl-modified silicone-based composition, or a fluorinated alkyl-modified silicone-based composition, the electrically insulating and thermally conductive sheet preferably contains a methylvinylsilicone-based rubber.

On the other hand, in the case in which the thermally conductive grease employed in the producing method described above contains a dimethylsilicone-based composition, a perfluoropolyether-based composition, a $C_6$–$C_{20}$ alkyl-modified silicone-based composition, or a methylphenylsilicone-based composition, the electrically insulating and thermally conductive sheet preferably contains a fluorosilicone-based rubber.

The thermally conductive filler included in the thermally conductive grease employed in the production method described above may be a mixture of fillers having different particle sizes.

As the heat generator which is an object for heat dissipation in the heat dissipation assembly of the present invention, a semiconductor device including a semiconductor element is preferable.

According to the heat dissipation assembly of the present invention, even if plural heat cycles are applied, occurrences of cracks in the electrically insulating and heat; conductible sheet can be prevented. Therefore, heat from the heat generator such as a semiconductor device or the like can be effectively dissipated while electrically insulating properties are maintained, over a long period of time. In addition, since a thermally conductive grease is filled in the microirregularities on the surfaces of the heat generator and the heat dissipator, thermal resistance can be effectively reduced, and a high heat dissipation rate can be exhibited. In particular, in the case of employing a specific combination of base materials of the thermally conductive grease and the electrically insulating and thermally conductive sheet, the effects described above are prominently exhibited.

In addition, according to the heat dissipation assembly of the present invention, even if the thermally conductive grease and/or the electrically insulating and thermally conductive sheet described above include a thermally conductive filler as a solid content, electrical insulation can be maintained over a long period of time, and effective heat dissipation can be carried out. In particular, in the case in which the thermally conductive filler is a mixture of fillers having different particle sizes, the charging rate of the thermally conductive filler can be increased. In addition, in the case in which the filler is contained in the thermally conductive grease, the charging rate can be increased while the consistency of the grease described above is well maintained, and for this reason, the heat dissipation efficiency can be further improved.

In the method for producing a heat dissipation assembly of the present invention, the heat dissipation assembly described above can be effectively produced. In particular, a thermally conductive grease can be thinly spread, and for this reason, in particular, the application operation can be effectively carried out, and thermal resistance can be further reduced. In addition, in the press-bonding step described above, the thermally conductive grease can be spread, and for this reason, bubbles in the grease can be removed, and heat dissipation efficiency can thereby be increased.

BRIEF DESCRIPTION OF THE DRAWINGS

FIG. 2 is subjected to a heat cycle of from a low temperature condition (FIG. 3A) to a high temperature condition (FIG. 3B);

FIG. 6 is a drawing showing an extension process of a thermally conductive grease which is subjected to a spot supply application;

FIG. 10A and FIG. 10B are conceptual diagrams showing the condition of the heat dissipation assembly under heat cycle of from a low temperature condition (FIG. 10A) to a high temperature condition (FIG. 10B) in the assembly shown in FIG. 7 and FIG. 8.

DETAILED DESCRIPTION OF THE INVENTION

Figure 1:
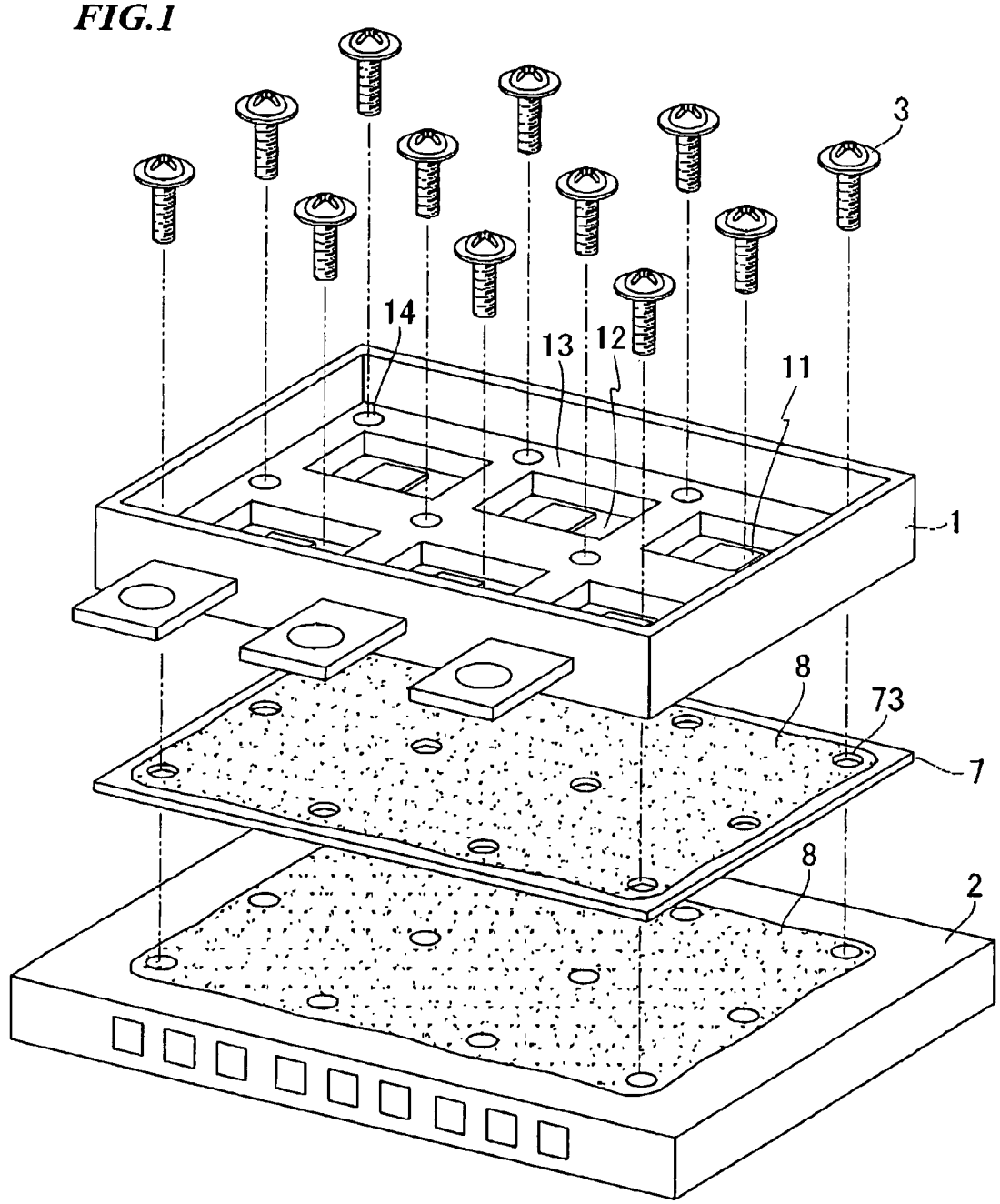
FIG. 1 is a drawing showing one embodiment of a heat dissipation assembly of the present invention.

The heat dissipation assembly of the present invention has a layer structure in which the thermally conductive grease layer comprising the thermally conductive grease which is incompatible with the electrically insulating and thermally conductive sheet is provided between the electrically insulating and thermally conductive sheet and the heat generator, and/or between the electrically insulating and thermally conductive sheet and the heat dissipator. Therefore, the heat from the heat generator is transferred via the heat generator to (the thermally conductive grease), then to the electrically insulating and thermally conductive shoot, then to (the thermally conductive grease), and then to the heat dissipator. As a result, the heat generator can be cooled.

The heat generator and the heat dissipator described above are not particularly limited. The heat dissipation assembly of the present invention is suitable for a combination of a heat generator and a heat dissipator which are to be electrically insulated, and is in particular suitable for use under severe conditions in which they are subjected to large changes in temperatures, such as in an automobiles and the like. Examples of the heat generators described above include, for example, various electronic devices equipped with parts such as electrodes to be insulated, such as semiconductor elements and the like, in which heat generated during operation must be removed. In addition, examples of the heat dissipators include known products having heat dissipating effects, such as jackets, heat pipes, heat sinks, and the like.

In the heat dissipation assembly of the present invention, as the electrically insulating and thermally conductive sheet, any sheets can be employed as long as they have both electrically insulating properties and thermally conductive properties. In view of adhesion between the heat generator and heat dissipator, a rubber sheet having elasticity is preferable.

As the electrically insulating and thermally conductive rubber sheets, rubber sheets comprising various base materials which are electrically insulating and thermally conductive can be employed. As the base materials for the rubber sheets described above, synthetic rubbers such as silicone rubbers, chlorosulfonated polyethylene rubbers, and the like, are preferable in view of thermal resistance, and in particular, silicone rubbers having high thermal resistance and exhibiting high electrically insulating properties are preferable.

The silicone raw rubber which is a main component of the silicone rubber described above is a polymer having a degree of polymerization approximately ranging from 5,000 to 10,000, having an average molecular weight ranging from 400,000 to 800,000, and having a viscosity ranging from a few million to over ten million centistokes. As the kinds of the silicone raw rubbers, mention may be made of a dimethylsilicone raw rubber (MQ indicated in accordance with ASTMD-1418), a methylvinylsilicone raw rubber (VMQ indicated in accordance with ASTMD-1418), a methylphenylvinylsilicone raw rubber (PVMQ indicated in accordance with ASTMD-1418), a fluorosilicone raw rubber (FVMQ indicated in accordance with ASTMD-1418), and the like. The dimethylsilicone raw rubber is a raw rubber having no unsaturated groups and having the same molecular structure as that of a silicone oil. The methylvinylsilicone raw rubber is a raw rubber in which a part of the methyl groups of the dimethylsilicone raw rubber is substituted with a vinyl group. The methylphenylvinylsilicone raw rubber is a raw rubber in which a part of the methyl groups of the dimethylsilicone raw rubber is substituted with a vinyl group and a phenyl group. The fluorosilicone raw rubber is a raw rubber in which a small amount of a methylvinylsiloxane is copolymerized to a methyltrifluoropropylsiloxane. In view of physical properties such as mold-processing properties, strength, compression setting properties, and the like, a methylvinylsilicone raw rubber, a fluorosilicone raw rubber in which a trifluoropropyl group is inserted to improve oil resistance and solvent resistance, and the like, are preferable.

The silicone raw rubbers described above are employed as a main raw material, and reinforcing fillers such as dry silica, wet silica, and the like, extending fillers such as diatomaceous earth, quartz powders, and the like, additives, crosslinking agents, and the like, are added thereto, thus producing silicone compounds. The silicone compound described above is crosslinked and cured, and is mold-processed, and thereby, a silicone rubber sheet can be produced. The mold-processing method and crosslinking and curing method for forming the silicone rubber sheet from the silicone compound described above vary depending on the catalysts employed. Known methods in the art can be employed therefor.

The silicone compound in which the silicone raw rubber is employed as a main raw material, and the reinforcing filler such as dry silica, wet silica, and the like, and the extending filler such as diatomaceous earth, quartz powders, and the like, are added, has a low thermally conductive property. For this reason, in order to impart a high thermally conductive property, to the silicone rubber compound, a thermally conductive filler such as powders of a metal oxide such as aluminum oxide ($Al_2O_3$), magnesium oxide (MgO), zinc oxide (ZnO), nickel oxide (NiO), titanium oxide ($TiO_2$), silicon oxide ($SiO_2$), vanadium oxide (VO), copper oxide (CuO), iron oxide (FeO), silver oxide (AgO), and the like, or powders of an inorganic compound such as aluminum nitride (AlN), boron nitride (BN), silicon carbide (SiC), silicon nitride (SiN), and the like, is preferably added. Thereby, a rubber sheet exhibiting a high thermally conductive property can be produced. If the electrically insulating properties of the rubber sheet, per se, are high, and the electrically insulating properties are maintained as a whole, powders of a metal such as aluminum, gold, silver, copper, nickel, iron, and the like, may also be employed. As the thermally conductive filler described above, commercially available products can be employed as they are.

The thermally conductive filler described above may be subjected to a surface treatment in order to improve dispersing properties to the silicone rubber compound described above, or improve physical properties of the rubber sheet. As examples of the surface treatments, mention may be made of, for example, a treatment with a silane coupling agent. As examples of silane coupling agents, mention may be made of n-hexyltrimethoxysilane, n-hexyltriethoxysilane, n-octyltriethoxysilane, n-decyltrimethoxysilane, phenyltrimethoxysilane, phenyltriethoxysilane, diphenyldimethoxysilane, diphenyldiethoxysilane, and the like.

The particle size of the thermally conductive filler described above is not limited. For example, those having a particle size ranging from 0.1 to 500 μm can be employed. A mixture of the thermally conductive fillers having different particle sizes can also be employed.

In addition, the blending amount of the thermally conductive filler is not limited. In general, if the blending amount is too small, the thermally conductive property is reduced. On the other hand, if the blending amount is too large, the thermally conductive property can be improved, but the physical strength of the rubber sheet is reduced. For this reason, the thermally conductive filler is preferably blended in an amount ranging from 50 to 2000 parts by weight, and preferably ranging from 100 to 1500 parts by weight, with respect to 100 parts by weight of the silicone rubber compound, although the blending amount varies depending on the materials of the rubber sheet.

In the heat dissipation assembly of the present invention, the thermally conductive grease means a grease having thermally conductive properties, and means, for example, a paste in the form of a grease or a compound, produced by blending a combination between a thickening agent and the thermally conductive filler or blending the thermally conductive filler exhibiting thickening effects, in a liquid polymer base oil.

As examples of the base oils described above, mention may be made of, for example, mineral oils such as paraffin-based oils and naphthene-based oils, and synthetic oils such as alpha-olefin polymers or oligomers, polyalkylene glycols, diesters (dibasic acid esters), trimellitic esters, polyol esters, perfluoropolyethers, polyphenyl ethers, liquid silicones, and the like. In view of electrically insulating properties and thermal resistance, as the base oil, a liquid silicone or a perfluoropolyether is preferable.

The liquid silicone described above may be liquid at room temperature (25° C.), and may have a straight chain structure or a branched chain structure. Examples of the liquid silicones described above include, for example, a straight-chain polydiorganosiloxane represented by the chemical formula shown in the following, and the like.

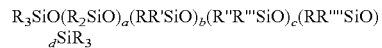

wherein R represents an alkyl group having 1 to 4 carbon atoms, and is preferably a methyl group, with the proviso that a part of the R may be a vinyl group or a hydroxyl group; R' represents a long-chain alkyl group having 6 to 20 carbon atoms, examples of which include a non-substituted alkyl group such as a hexyl group, a decyl group, a dodecyl group, and the like, or an aryl-substituted alkyl group such as a 2-phenylethyl group, a 2-phenylpropyl group, and the like; R" represents an aryl group such as a phenyl group; R'" has the same meanings as described in R or R"; R"" represents a fluorinated alkyl group having 1 to 4 carbon atoms such as a 3,3,3-trifluoropropyl group; and a, b, c, and d represent 0 or a positive number so that a viscosity at 25° C. ranges from 10 cs to 500,000 cs.

In view of grease properties, the viscosity at 25° C. of the straight-chain polydiorganosiloxane preferably ranges from 20 cs to 30,000 cs.

As the straight-chain polydiorganosiloxanes, in view of general versatility of the greases, the silicones (1) to (4) shown in the following are preferable.

(1) Dimelthylsilicone:

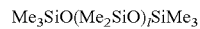

wherein Me represents a methyl group; and l represents a positive integer.

(2) Methylphenylsilicone:

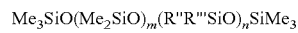

wherein Me represents a methyl group; R" represents a methyl group or a phenyl group; R'" represents a phenyl group; m represents 0 or a positive integer; and n represents a positive integer.

As specific examples thereof, mention may be made of

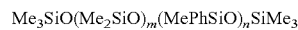

or

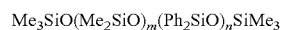

wherein each of Me, m and n has the same meaning as above.

(3) $C_6$–$C_{20}$ alkyl-modified Silicone:

$$Me_3SiO(Me_2SiO)_o(MeR'SiO)_p(R''R'''SiO)_qSiMe_3$$

wherein Me represents a methyl group; R' represents an alkyl group having 6 to 20 carbon atoms, examples of which include a non-substituted alkyl group such as a hexyl group, a decyl group, a dodecyl group, or the like, and an aryl-substituted alkyl group such as a 2-phenylethyl group, a 2-phenylpropyl group, or the like; R'' represents a methyl group or a phenyl group; R''' represents a phenyl group; p represents a positive integer; and o and q respectively represents 0 or a positive integer.

More particularly, various products such as those having the structural formulae:

$$Me_3SiO(Me_2SiO)_o(Me(C_{12}H_{25})SiO)_p(MePhSiO)_qSiMe_3$$

and $$Me_3SiO(Me_2SiO)_o(Me(PhC_2H_4)SiO)_p(MePhSiO)_qSiMe_3$$

wherein each of Me, o, p, and q has the same meaning as above, are commercially available.

(4) Fluorinated Alkyl-modified Silicone:

$$Me_3SiO(Me_2SiO)_r(MeR''''SiO)_sSiMe_3$$

wherein Me represents a methyl group; R'''' represents a fluorinated alkyl group; r represents 0 or a positive integer; and s represents a positive integer.

More particularly, there is a product as follows:

$$Me_3SiO(Me(CF_3CH_2CH_2)SiO)_sSiMe_3$$

wherein each of Me and s has the same meaning as above.

The silicones (1) to (4) described above may be a branched one in which the methyl group as the side chain is substituted with another siloxane group or one in which the terminal group is substituted with a hydroxyl group, a vinyl group, or the like.

Examples of the perfluoropolyethers described above include, for example, those having the structural formula described in the following:

$$A-(C_3F_6O)_x(CF_2O)_y(C_2F_4O)_z-B$$

wherein the terminal group A represents —F, —$CF_3$, —$C_2F_5$, —$C_3F_7$, —$CF(CF_3)OCF_3$, —OF, —$OCF_3$, —$OC_2F_5$, —$OC_3F_7$, or —$OCF(CF_3)OCF_3$; the terminal group B represents —$CF_3$, —$C_2F_5$, —$C_3F_7$, or —$CF(CF_3)OCF_3$; X, y, and z represent 0 or a positive integer, and (x+y+z)>1 so that the viscosity at 25° C. ranges from 50 to 500,000 cs.

Examples of the perfluoropolyethers described above include, for example, those described in the following:

$$CF_3O-(CF_2CF(CF_3)O)_x(CF_2O)_y-CF_3$$

wherein x and y are the same as described above, $$CF_3O-(CF_2O)_y(C_2F_4O)_z-CF_3$$

wherein y and z are the same as described above, $$CF_3O-(CF_2CF(CF_3)O)_x-CF_3$$

wherein x is the same as described above, and $$F-(CF_2CF_2CF_2O)_x-C_2F_5$$

wherein x is the same as described above.

As the thermally conductive filler blended in the base oil, the same one as the thermally conductive filler blended in the rubber composition described above can be employed. In particular, in view of providing thickening effects, the metal oxide powders and inorganic compound powders described above are preferable. If the electrically insulating properties of the base oil are high and it is possible to maintain the electrically insulating properties of the grease as a whole, powders of a metal such as aluminum, gold, silver, copper, nickel, iron, or the like, may also be employed. As the thermally conductive filler described above, commercially available products can be employed, as they are.

The thermally conductive filler may be subjected to a surface treatment in order to improve dispersing properties to the base oil. In addition, the particle size of the thermally conductive filler is not limited, and for example, the thermally conductive fillers having the particle size ranging from 0.1 to 500 μm are employed. In addition, a mixture of the thermally conductive fillers having different particle sizes can also be employed. In this case, since the consistency of the thermally conductive grease is not reduced, and the blending ratio of the thermally conductive filler can be increased, thermal resistance can be greatly reduced. In the case of employing a mixture of the thermally conductive fillers having different particle sizes, for example, the average particle size of one filler can be ½ to 1/50 of the average particle size of another filler.

The blending amount of the thermally conductive filler in the base oil varies depending on the kinds of the fillers described above, presence or absence or a combination of the thermally conductive fillers having different particle sizes, and the like. It preferably ranges from 10 to 1000 parts by weight with respect to 100 parts by weight of the base oil.

As the thickening agent blended together with the thermally conductive filler, if necessary, known products may be employed. For example, metallic soap-based thickening agents such as lithium soap, calcium soap, aluminum soap, lithium composite soap, aluminum composite soap, and the like; inorganic thickening agents such as bentonite, silica gel, and the like; or organic thickening agents such as urea compounds, copper phthalocyanine, and the like, can be employed.

Methods for producing the thermally conductive grease are known. For example, the base oil and the thermally conductive filler may be mixed in a stirrer under heated conditions, and a thickening agent may be mixed thereto, if necessary. The mixture is cooled, followed by homogenizing it by a roller, thus producing a thermally conductive grease.

In the present invention, among the electrically insulating and thermally conductive sheets and the thermally conductive greases described above, the sheet and the grease which are incompatible with each other are selected and are combined for use.

Here, the concept of "compatibility" is described. For example, in the heat dissipation assembly shown in FIG. 7 to FIG. 10, when the sheet 4 contacts to the grease 6, that is, two material bodies contact so that the silicone oil base material 61 in the grease 6 penetrates into the sheet 4 comprising the silicone rubber base material 41 during use for a long time, a property in which the substance migration in significant quantities from one material body to another material body occurs is referred to as "compatibility" herein. Therefore, in the heat dissipation assembly shown in FIG. 7 to FIG. 10, the grease 6 and the sheet 4 are mutually "compatible". The term "compatibility" employed herein does not indicate properties in which two material bodies are mutually dissolved to unite as viewed macroscopically, but does indicate properties in which two material bodies have migration of any substances in significant quantities via the contacting surfaces thereof. Therefore, the two material bodies described above can contact each other while maintaining the independent forms. For example, the two material bodies described above can be in the form of a solid and a paste (such as a grease and the like), a solid and a liquid (such as an oil and the like), or a solid and a solid.

On the other hand, in the heat dissipation assembly of the present invention, the thermally conductive grease and the electrically insulating and thermally conductive sheet which are present between the heat dissipator and the heat generator are not mutually compatible; they are "incompatible". That is, there is no substance transition or is very slight substance migration between the thermally conductive grease and the electrically insulating and thermally conductive sheet. Herein, "slight" substance migration typically means that changes in weight of the thermally conductive grease or the electrically insulating and thermally conductive sheet which is subjected to the substance migration is less than 10% by weight, is preferably less than 5% by weight, is more preferably less than 2% by weight, and is, in particular, preferably less than 1% by weight.

As described above, in the present invention, the combination between the thermally conductive grease and the electrically insulating and thermally conductive sheet which are "incompatible" is employed, and for this reason, even if they contact, substance migration does not substantially occur. Therefore, in the heat dissipation assembly of the present invention, it is not observed that by swelling the electrically insulating and thermally conductive sheet, physical properties such as strength, elongation, and the like, are deteriorated. In addition, the thermally conductive grease remains in a paste form, and does not solidify. For these reasons, the heat dissipation assembly of the present invention can effectively exhibit heat dissipation effects while electrically insulating properties are maintained over a long time.

Figure 2:
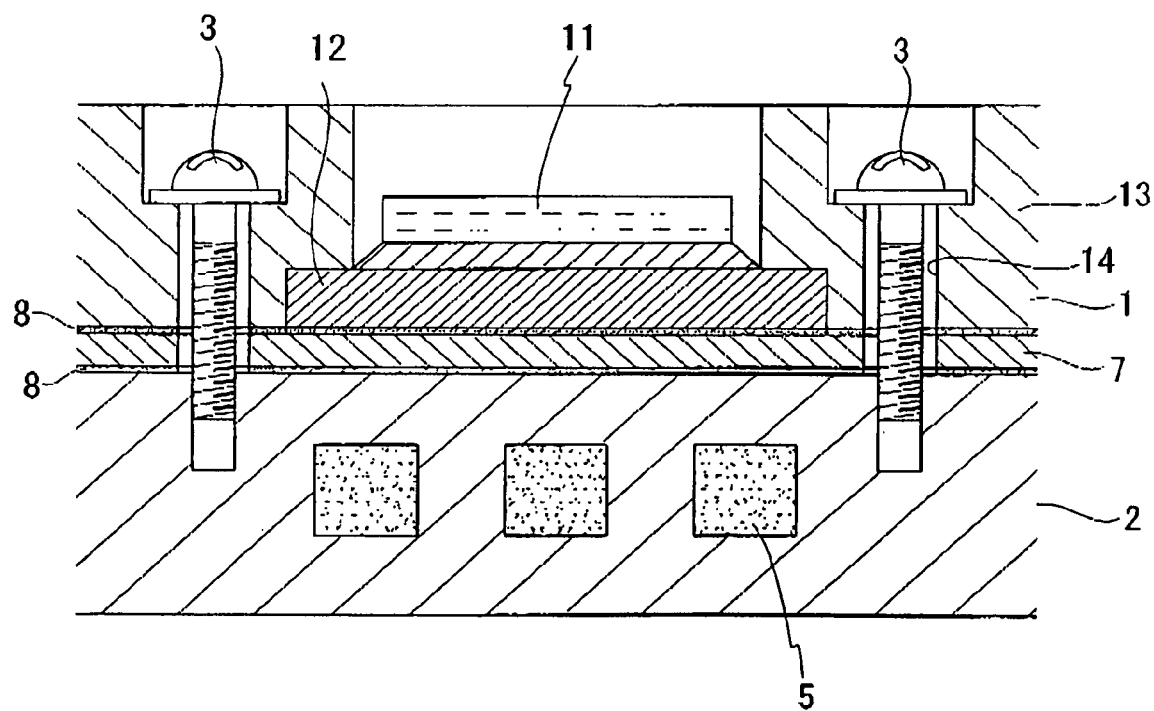
FIG. 2 is a cross-sectional view of the heat dissipation assembly shown in FIG. 1.

One embodiment of the heat dissipation assembly of the present invention is described by way of FIG. 1 and FIG. 2. In FIG. 1 and FIG. 2, a bonding wire for power distribution and a sealing resin are not shown.

In the heat dissipation assembly of the present invention shown in FIG. 1 and FIG. 2, a semiconductor element 11 is fixed to a resin molding part 13 of a semiconductor device 1, together with electrode plates 12. The electrode plates 12 form a surface part of the resin molding part 13. The material of the electrode plates 12 is not particularly limited, and any electrically conductive substances can be employed therefor. In view of electrically conductive properties and thermally conductive properties, metals are preferable, and in particular, copper-based metals are preferable. The materials of the resin molding parts 13 are also not particularly limited, and any thermoplastic or thermosetting resins such as polyphenylene sulfide, polybutylene terephthalate, phenol resins, and the like, can be employed. The resin materials exhibiting high insulating properties and high thermal resistance are preferable.

In the resin molding part 13, plural fixing holes 14 are formed, and the resin molding part 13 is fixed to the heat sink 2 by means of fixing screws 3 which are inserted in the fixing holes 14. The heat sink 2 is preferably made of a metal in view of thermally conductive properties, and is, in particular, preferably made of an aluminum-based metal or a copper-based metal. In the heat sink 2, coolant passages 5 are formed. In the coolant passages b, a coolant for heat dissipation is circulated. The coolant for heat dissipation is not particularly limited, and water or conventional coolants such as organic solvents or the like, can be employed.

In the heat dissipation assembly of the present invention shown in FIG. 1 and FIG. 2, between the resin molding part 13 and the heat sink 2, an electrically insulating and thermally conductive sheet/(hereinafter, simply referred to as "sheet 7") is inserted. The sheet 7 electrically insulates between the heat sink 2 and the electrode plates 12 on the surface of the resin molding part 13. In addition, on the surface of the sheet 7, opposed to the resin molding part 13, a thermally conductive grease 8 (hereinafter, simply referred to as "grease 8") is applied. In addition, on the surface of the heat sink 2, opposed to the sheet 7, a grease 8 is applied. Under the conditions described above, the sheet 7 is integrated with the heat sink 2 and the resin molding part 13 of the semiconductor device 1 by means of fixing screws 3 through fixing holes 73. The thickness of the sheet 7 is not particularly limited, and preferably ranges from 0.01 to 5 mm, and more preferably ranges from 0.1 to 3 mm. If it is below 0.01 mm, the electrically insulating properties may be reduced. On the other hand, if it exceeds 5 mm, the thermally conductive property may be reduced.

In the embodiment of the heat dissipation assembly 1 shown in FIG. 1 and FIG. 2, the heat generated in the semiconductor element 11 is dissipated via the electrode plate 12 to grease 8, then to sheet 7, then to grease 8, then to heat sink 2, and then to coolant passage 5. In the embodiment shown in FIG. 1 and FIG. 2, the grease 8 is filled in the microirregularities on the surfaces of the heat sink 2 and the electrode plates 12, and microscopic air gap which may provide thermal resistance is not present on the contacting faces between the electrode plates 12 and the sheet 7 and between the heat sink 2 and the sheet 7. For this reason, the case described above can greatly reduce thermal resistance, compared to the case in which the grease 8 is not applied. The thickness of the layer of the grease 8 may vary depending on the surface conditions of the sheet 7 and the heat sink 2, and preferably ranges from 0.01 to 2 mm, and more preferably ranges from 0.1 to 1 mm. If the thickness is below 0.01 m, lubricating properties may be impaired. On the other hand, if it exceeds 2 mm, thermal resistance may increase.

In the embodiment of the heat dissipation assembly shown in FIG. 1 and FIG. 2, application patterns of the grease 8 are not particularly limited. The grease 8 may be applied to both surfaces of the sheet 7 and/or to the surfaces of the resin molding part 13 and heat sink 2. In view of reduction in thermal resistance, it is preferable that the grease 8 be present on both surfaces of the sheet 7, as shown in the drawings. In addition, the order for integrating the semiconductor device 1 and heat sink 2 is not particularly limited. One surface of the sheet 7 may be press-bonded to the semiconductor device 1 (resin molding part 13), and another surface of the sheet 7 may be subsequently press-bonded to the heat sink 2, or alternatively, the aforementioned steps may be carried out in reverse. However, in view of simplification of the steps, integration of the semiconductor device 1, sheet 7, and heat sink 2 is preferably carried out simultaneously.

The means for application described above is not particularly limited, and any applicators such as rollers, blades, wires, and the like, can be employed. In addition, the grease 8 may be subjected to a spot supply application by means of a known applicator such as a dispenser or the like. The amount of the spot supply application varies depending on the desired thickness of the grease 8, and preferably ranges from 10 to 100 mg per spot.

In the following, operation in the case in which the heat dissipation assembly shown in FIG. 1 and FIG. 2 is subjected to a heat cycle of from a low temperature condition to a high temperature condition is described by way of FIG. 3A and FIG. 3B. In the heat dissipation assembly shown in FIG. 3A and FIG. 3B in which between the semiconductor device 1 and the heat sink 2, the sheet 7 of which the grease 8 is applied on both surfaces is interposed, the grease 8 comprises a base oil 81 and a thermally conductive filler 82, and the sheet 7 comprises a silicone compound 71 and a thermally conductive filler 72.

Figure 3A:
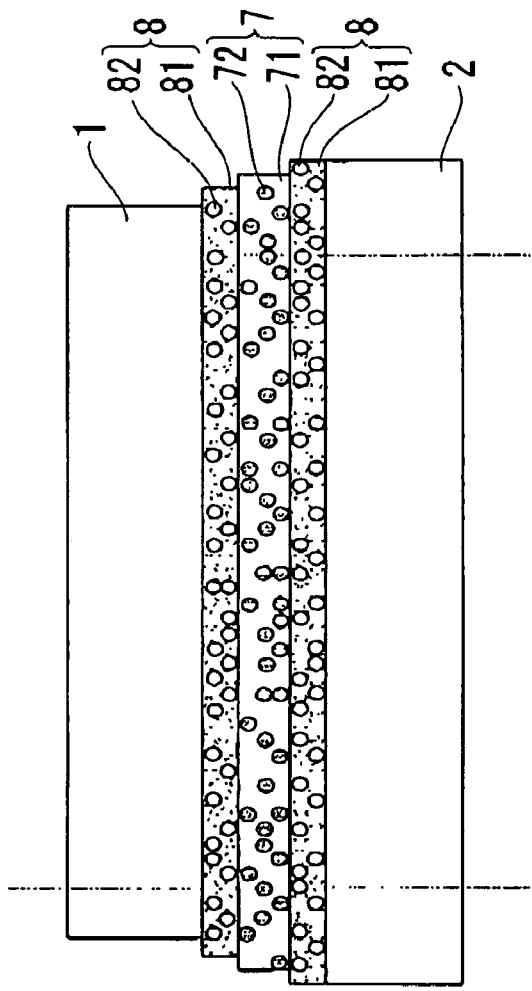
FIG. 3A and FIG. 3B are conceptual diagrams showing the conditions of the heat dissipation assembly in the case in which the heat dissipation assembly shown in FIG. 1
Figure 3B:
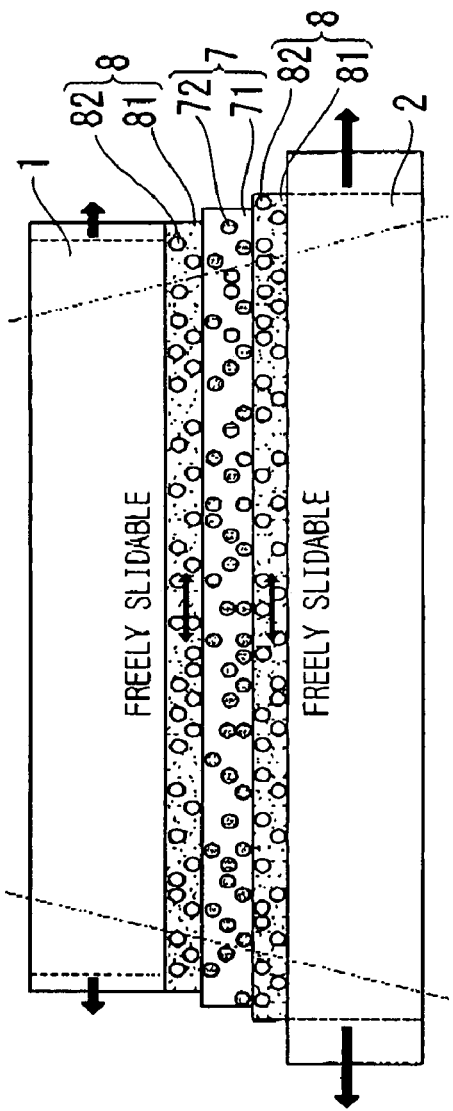

For example, in the case in which the electrode plates (not shown in the drawing) forming a part of the bottom face of the resin molding part of the semiconductor device 1 are made of copper, the heat sink 2 is made of aluminum, and a coefficient of linear expansion of copper is lower than that of aluminum, under the low temperature conditions shown in FIG. 3A, the heat dissipation assembly has an upwardly convex warping, under the high temperature conditions shown in FIG. 3B, the heat dissipation assembly has a downwardly convex warping, which is not shown in the drawing. In the case of a semiconductor device employed in an automobile, the semiconductor device is exposed to a heat cycle ranging from −20° C. or lower to +100° C. or higher, due to whether, engines, and the like, irrespective of operating semiconductor elements.

Here, under the heat cycle of from the low temperature condition (FIG. 3A) to the high temperature condition (FIG. 3B), on both surfaces of the sheet 7, different displacements are exerted from the semiconductor device 1 (electrode plates thereof) and the heat sink 2. However, in the heat dissipation assembly of the present invention shown in FIG. 3, the sheet 7 is incompatible with the grease 8, and there is no substantial migration of substances such as base oils and the like from the grease 8 to the sheet 7. For this reason, the grease 8 can be maintained in the form of a paste. In addition, due to lubricating effects of the grease 8, the sheet 7 and the semiconductor device 1, as well as the sheet 7 and the heat sink 2 can freely and relatively move. Therefore, on both surfaces of the sheet 7, compressive force and/or tensile force from the semiconductor device 1 (electrode plates thereof) and the heat sink 2 are not transferred, or can be reduced to the extent of providing no effects.

As described above, in the heat dissipation assembly or the present invention, the grease 8 can exhibit lubricating effects without denaturing over a long period, and for this reason, compressive force and/or tensile force from the electrode plates and the heat sink 2 can be removed or can be reduced. In addition, migration of substances such as base oils and the like from the grease 8, which is incompatible with the sheet 7, to the sheet 7 can be substantially avoided. For this reason, the sheet 7 can maintain mechanically physical properties thereof (such as tensile strength, elongation properties, and the like) over a long period. Therefore, even in the case of repeatedly providing heat cycles over a long period, no cracks and the like occur in the sheet 7, and occurrences of insulating defects between the semiconductor device 1 and the heat sink 2 can be prevented over a long period.

A typical example in which two material bodies are "compatible" is the case in which the two material bodies described above comprise substances having similar chemical structures. For example, in the heat dissipation assembly shown in FIG. 7 to FIG. 10, since the sheet 7 and the grease 8 independently comprise a dimethylpolysiloxane-based silicone, the dimethylpolysiloxane components migrate from the grease 8 to the sheet 7 on the molecular level.

In the heat dissipation assembly shown in FIG. 1 to FIG. 3, it is preferable that the chemical structure of the base material of the sheet 7 be not similar to that of the base material of the grease 8. For example, in the case of employing a methylvinylsilicone-based rubber sheet as the sheet 7, as the base oil of the grease 8, a polyorganosiloxane other than dimethylsilicone, such as a $C_6$–$C_{20}$ alkyl-modified silicone oil, a fluorinated alkyl-modified silicone oil, or a perfluoropolyether oil is preferable. In addition, in the case of employing a fluorosilicone-based rubber sheet as the sheet 7, as the base oil of the grease 8, a polyorganosiloxane other than fluorosilicone, such as a dimethylsilicone oil, a $C_6$–$C_{20}$ alkyl-modified silicone oil, a methylphenylsilicone oil, or a perfluoropolyether oil is preferable.

In the following, mode of filling of the thermally conductive filler with respect to the grease 8 is described by reference to FIG. 4A to FIG. 4C.

Figure 4A:
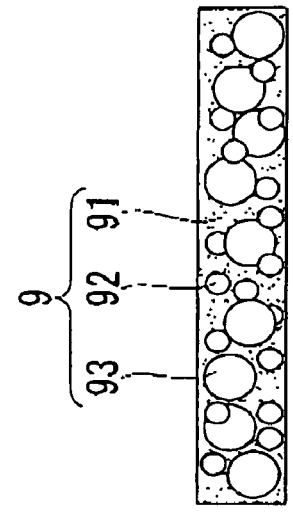
FIG. 4A, FIG. 4B, and FIG. 4C are drawings showing patterns of filling the thermally conductive filler in the thermally conductive grease.
Figure 4B:
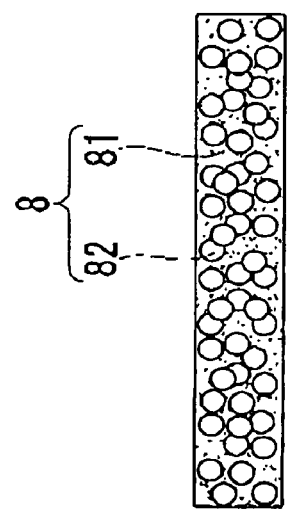

FIG. 4A shows an example of the grease 8 in which fillers 82 having the same particle size are blended at a low filling rate. On the other hand, FIG. 4B shows an example of the grease 8 in which fillers 82 having the same particle size are blended at a high filling rate. Any improvements in thermally conductive properties cannot be observed in the case of a low filling rate of the filler 81. For this reason, the filling pattern of the filler shown in FIG. 4B is preferable in view of heat dissipation. However, when the filling rate of the fillers 82 is increased, consistency of the grease 8 is reduced, and becomes hard. As a result, it is difficult to thinly apply the grease. Therefore, in the filling pattern shown in FIG. 48, consequently, the thickness of the layer of the grease 8 applied must be increased, and for this reason, thermal resistance of the layer of the grease 8 is increased as a whole.

Figure 4C:
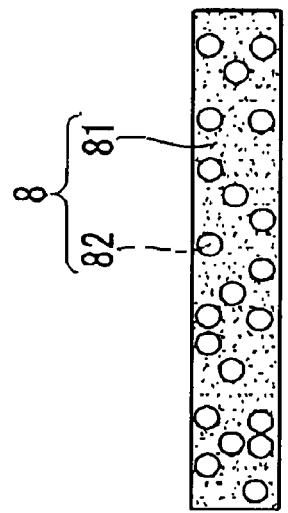

As shown in FIG. 4C, it is preferable that thermally conductive fillers 92 and 93 having different particle size be mixed and be blended in a base oil 91 to produce a grease 9. In this case, even if the filling rate of the fillers 92 and 93 in the thermally conductive base oil 91 is increased, consistency of the grease 9 is not reduced. Therefore, the thickness of the layer of the grease 9 applied, comprising relatively large amounts of fillers 92 and 93, can be reduced. For this reason, thermal resistance of the layer of the grease 9 can be greatly reduced with improvements in thermally conductive properties of the grease 9, per se.

In addition, it is generally more difficult to thinly apply grease to the surface of the sheet 7 made of rubber, compared to the case in which grease is applied to the surfaces of the electrode plates 12 made of metal and/or the heat sink 2 made of metal. However, a grease 9 having a high consistency can be thinly applied with easiness even to the surface of the sheet 7 made of rubber. For this reason, it can be controlled to increase in thermal resistance due to the presence of the grease layer, per se.

Figure 5:
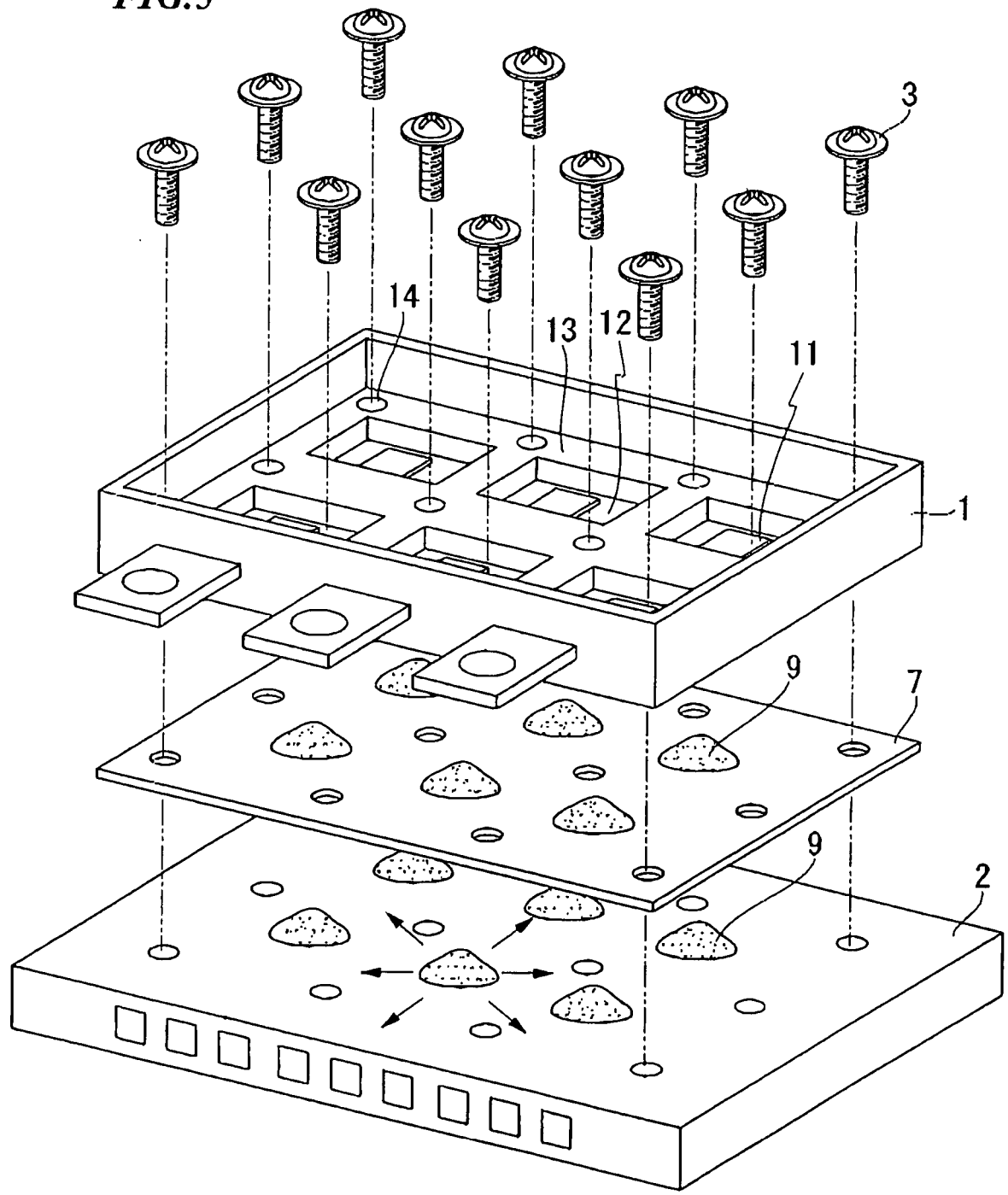
FIG. 5 is a drawing showing another embodiment of a heat dissipation assembly of the present invention.
Figure 7:
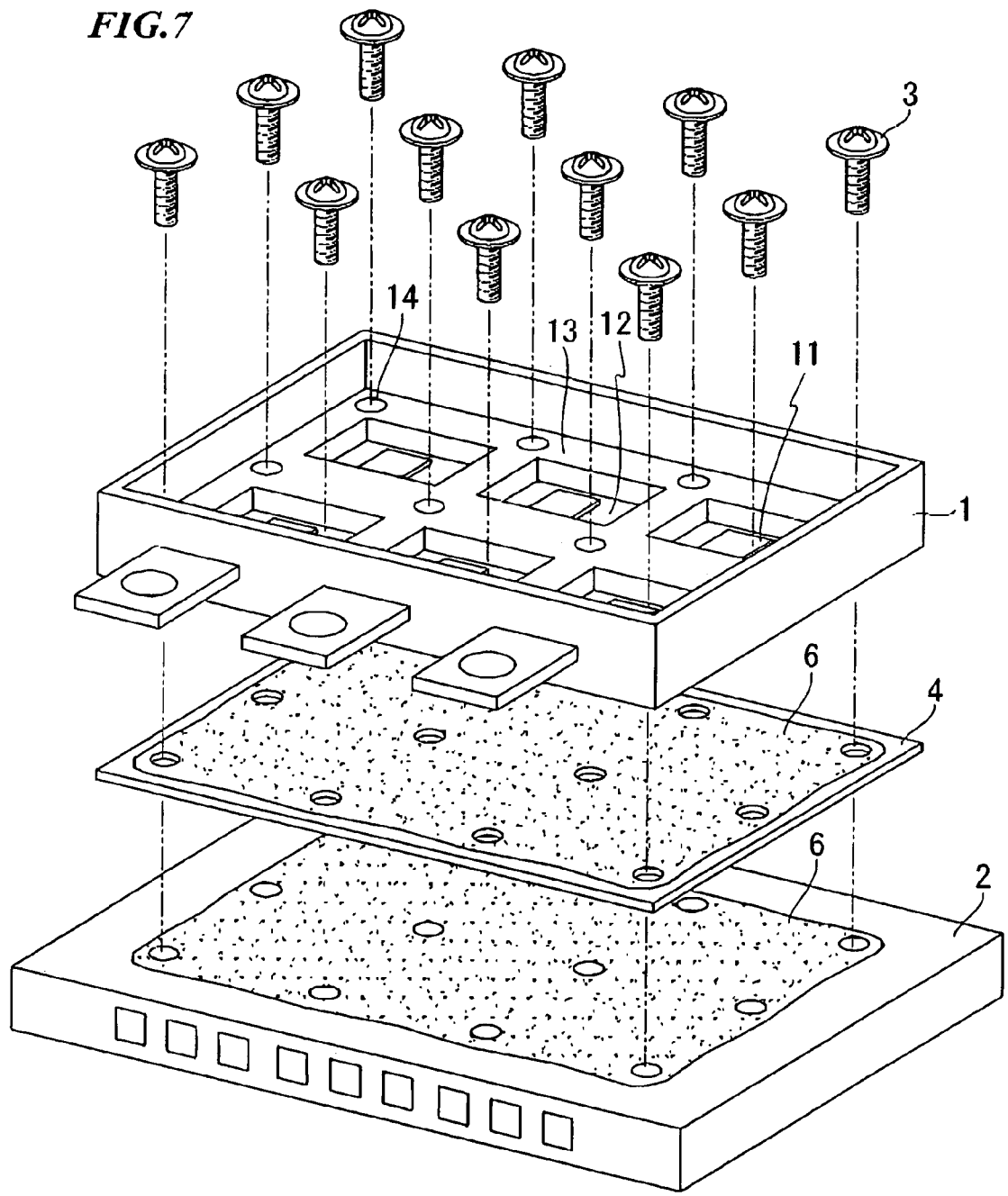
FIG. 7 is a drawing showing a conventional heat dissipation assembly.
Figure 8:
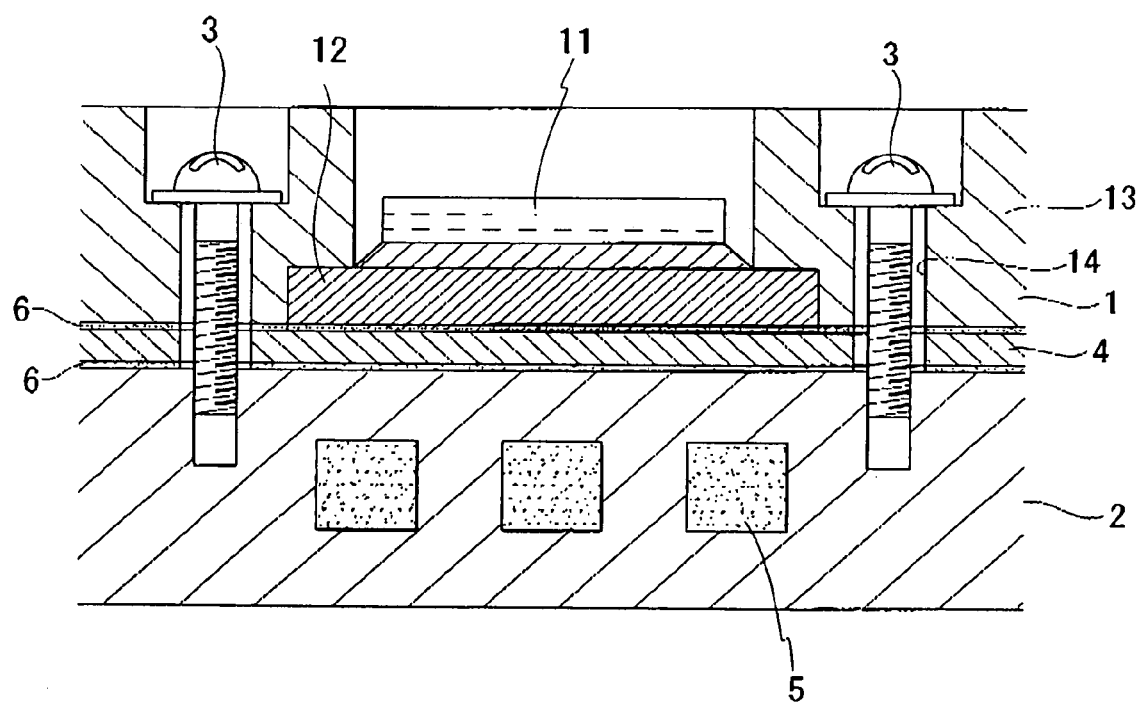
FIG. 8 is a cross-sectional view of the conventional heat dissipation assembly shown in FIG. 7.
Figure 9:
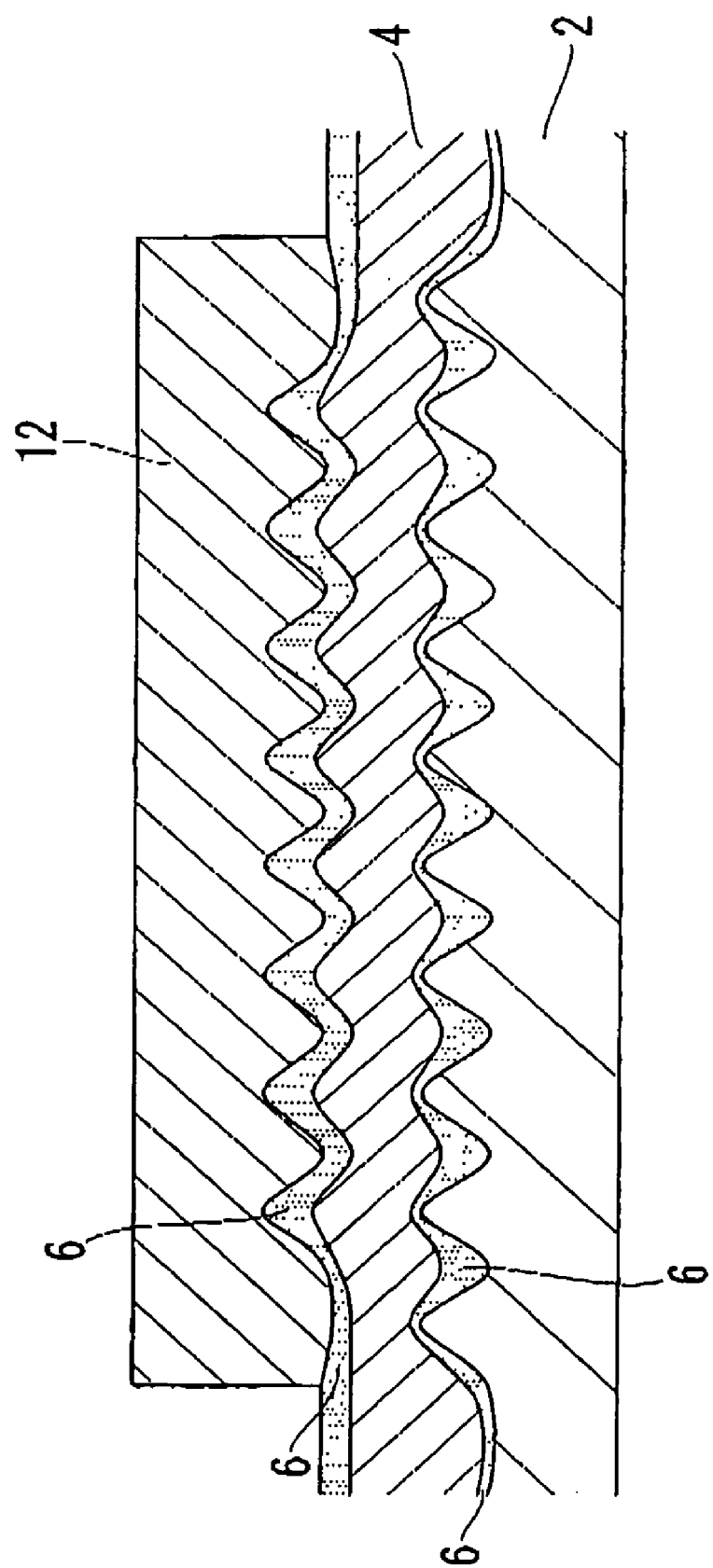
FIG. 9 is an enlarged conceptual view of the contacting parts between the sheet 4 and the electrode plates 12 and between the sheet 4 and the heat sink 2 in the assembly shown in FIG. 7 and FIG. 8.

FIG. 5 and FIG. 6 show one embodiment of a method for producing the heat dissipation assembly of the present invention in which the grease 9 is employed. The same members as those in FIG. 3 have the identical symbols thereto, and the description thereof is omitted.

First, using a known dispenser, the grease 9 is subjected to a spot supply application on one of the surfaces of the sheet 7 which faces the resin molding part 13 of the semiconductor device 1 and is subjected to a spot supply application on the surface of the heat sink 2 opposed to the sheet 7.

Subsequently, by fastening the fixing screws 3, the resin molding part 13, the sheet 7, and the heat sink 2 are simultaneously integrated, thus forming a heat dissipation assembly. As shown in FIG. 6, between the heat sink 2 and the sheet 7, the grease 9 can be extended from spots to a sheet, and for this reason, air bubbles in the grease 9 are forced out thereof and are removed. Thereby, thermal resistance of the grease 9 can be further removed, and good thermally conductive properties can be maintained. In particular, by use of the grease 9 having high consistency, removal of air bubbles can be carried out well.

The order for integration described above is not limited thereto. The sheet 7 and one of the resin molding part 13 and the heat sink 2 may be previously integrated, and subsequently, the sheet 7 and the remainder of the resin molding part 13 and the heat sink 2 may be integrated. In view of the number of steps, simultaneous integration of the resin molding part 13, the sheet 7, and the heat sink 2 by means of fixing screws 3 is preferable.

By controlling torque of the fixing screws 3, the conditions of the air bubble removal from the grease 9 can also be controlled.

Embodiments

REFERENCE EXAMPLES

A methylvinylsilicone raw rubber-based silicone rubber sheet (Sarcon TR, produced by Fujipoly Co., Ltd., hereinafter, referred to as "MS sheet") and a fluorosilicone raw rubber-based silicone rubber sheet (hereinafter, referred to as "FS sheet") were independently immersed in various base oils for 200 hours at 70° C. Subsequently, the weight of each of the silicone rubber sheets was measured. A rate of increase in weight with respect to the weight before immersion (expansion coefficient: % by weight) was calculated. The results are shown in Table 1.

TABLE 1

| Reference Example | Rubber sheet | Base oil | Expansion coefficient (% by weight) |
|---|---|---|---|
| 1 | MS sheet | Perfluoropolyether oil | −0.2 |
| 2 | MS sheet | Dodecyl-modified methylsilicone oil | −0.2 |
| 3 | MS sheet | Fluorinated alkyl-modified silicone oil | −0.6 |
| 4 | FS sheet | Dimethylsilicone oil | 0.2 |
| 5 | FS sheet | Dodecyl-modified methylsilicone oil | 0.0 |
| 6 | FS sheet | Methylphenylsilicone oil | −0.2 |
| 7 | FS sheet | Perfluoropolyether oil | 0.2 |
| 8 | MS sheet | Dimethylsilicone oil | 32.0 |
| 9 | MS sheet | Methylphenylsilicone oil | 33.2 |
| 10 | FS sheet | Fluorinated alkyl-modified silicone oil | 31.7 |

The combination between the rubber sheet and the base oil of each of Reference Examples 1 to 6 is "incompatible", and the combination between the rubber sheet and the base oil of each of Reference Examples 7 to 10 is "compatible". The combination between the rubber sheet and the base oil in which the expansion coefficient described above is not more than 10% by weight can be employed as the base materials of the electrically insulating and thermally conductive sheet and the thermally conductive grease although this may vary depending on coefficients of linear expansion of the heat generator and the heat dissipator. Therefore, the combinations of the rubber sheets and the base oils of the Reference Examples 1 to 6 are preferable as the electrically insulating and thermally conductive sheet and the thermally conductive grease. Each of the base oils employed in Reference Examples 1 to 10 is described in the following.

Perfluoropolyether Oil
Product name: FOMBLIN M15 produced by Ausimont Company (copolymer of difluoromethylene oxide and tetrafluoroethylene oxide, having an average molecular weight of 8000, and corresponding to $CF_3O—(CF_2O)_y(C_2F_4O)—CF_3$ described above).

Dimethylsilicone Oil
Polydimethylsiloxane having a viscosity at 25° C. of 500 cs (corresponding to $Me_3SiO(Me_2SiO)_l SiMeq_3$ described above).

Methylphenylsilicone Oil
Polydimethylmethylphenylsiloxane comprising 5% by mol of phenyl groups, and having a viscosity at 25° C. of 100 cs (corresponding to $Me_3SiO(Me_2SiO)_m(R''R'''SiO)_n SiMe_3$ described above).

Dodecyl-modified Methylsilicone Oil
Polydimethylmethyldodecylsiloxane comprising 45% by mol of decyl groups, and having a viscosity at 25° C. of 800 cs (corresponding to $Me_3SiO(Me_2SiO)_o(MeR'SiO)_p(R''R'''SiO)_q SiMe_3$ described above).

Fluorinated Alkyl-modified Silicone Oil
Polymethyl 3,3,3-trifluoropropylsiloxane having a viscosity at 25° C. of 300 cs (corresponding to $Me_3SiO(Me_2SiO)_r(MeR''''SiO)_u SiMe_3$ described above).

Embodiment 1
To a base in which 5 parts by weight of dry silica (silicon dioxide powder, Nippon Aerosil Co., Ltd., product name: Aerosil 200) as a reinforcing filler was mixed and kneaded with 100 parts by weight of methylvinylsilicone raw rubber, 700 parts by weight of aluminum oxide (produced by Showa Denko Co., Ltd., product name AL-30) was added as a thermally conductive filler, thus producing a compound. Subsequently, a curing agent comprising 50% bis-2,4-dichlorobenzoyl peroxide was added, as a curing agent, in an amount of 5 parts by weight with respect to 100 parts by weight of the methylvinylsilicone raw rubber in the compound, and was uniformly dispersed and mixed, thus producing a compsition. Subsequently, the composition was subjected to primary curing for 5 minutes at 120° C. using a thermovulcanizing press, and was subsequently subjected to secondary curing for 4 hours at 200° C. in a hot air oven, thus producing a silicone rubber sheet having a thickness of 0.20 mm.

On the other hand, 27 parts by weight of the perfluoropolyether oil employed in the Reference Examples was kneaded with 73 parts by weight of aluminum oxide powders (particle size=2 microns), and the mixture was homogenized by means of three rollers, thus producing a perfluoropolyether grease having a consistency of 220.

In the heat dissipation assembly shown in FIG. 1 and FIG. 2, equipped with a semiconductor device 1 having a size of bottom face of approximately 200 mm×150 mm, in which the silicone rubber sheet described above was employed as the sheet 7, and the perfluoropolyether grease described above was employed as the grease 8, a heat cycle test for 30 minutes at −40° C. and for 30 minutes at 120° C. was carried out. Even after 5 cycles, no abnormalities occurred in the silicone rubber sheet and the perfluoropolyether grease, and a continuous use could be carried out.

Comparative Embodiment 1
A heat cycle test was carried out under the same conditions as described in Embodiment 1, with the exception of the use of a polydimethylsiloxane grease having a consistency of 250, produced by mixing 69 parts by weight of zinc oxide (particle size=0.5 microns) in 31 parts by weight of the dimethylsilicone oil employed in the Reference Examples, instead of the perfluoropolyether grease employed in Embodiment 1. In the first cycle, cracks occurred in the silicone rubber sheet, and the assembly could not be continuously used.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A heat dissipation assembly comprising:
   a) a heat generator;
   b) a heat dissipator integrated with the heat generator;
   c) an electrically insulating and thermally conductive sheet configured to integrate the heat generator and the heat dissipator; and
   d) a thermally conductive grease layer formed from a thermally conductive grease which is incompatible with the electrically insulating and thermally conductive sheet such that substance migration does not substantially occur between the thermally conductive grease layer and the electrically insulating and thermally conductive sheet, the thermally conductive grease layer provided between at least one of (i) the electrically insulating and thermally conductive sheet and the heat generator and (ii) the electrically insulating and thermally conductive sheet and the heat dissipator.

2. The heat dissipation assembly of claim 1, wherein the thermally conductive grease layer is provided on opposing surfaces of the electrically insulating and thermally conductive sheet.

3. A heat dissipation assembly comprising:
   a) a heat generator;
   b) a heat dissipator integrated with the heat generator;
   c) an electrically insulating and thermally conductive sheet configured to integrate the heat generator and the heat dissipator; and
   d) a thermally conductive grease layer formed from a thermally conductive grease which is incompatible with the electrically insulating and thermally conductive sheet such that substance migration does not substantially occur between the thermally conductive grease layer and the electrically insulating and thermally conductive sheet, the thermally conductive grease layer provided between at least one of (i) the electrically insulating and thermally conductive sheet and the heat generator and (ii) the electrically insulating and thermally conductive sheet and the heat dissipator;
   wherein the thermally conductive grease comprises one of (i) a perfluoropolyether-based composition, (ii) a $C_6$–$C_{20}$ alkyl-modified silicone-based composition, and (iii) a fluorinated alkyl-modified silicone-based composition, and the electrically insulating and thermally conductive sheet comprises a methyl vinyl silicone-based rubber.

4. A heat dissipation assembly comprising:
   a) a heat generator;
   b) a heat dissipator integrated with the heat generator;
   c) an electrically insulating and thermally conductive sheet configured to integrate the heat generator and the heat dissipator; and
   d) a thermally conductive grease layer formed from a thermally conductive grease which is incompatible with the electrically insulating and thermally conductive sheet such that substance migration does not substantially occur between the thermally conductive grease layer and the electrically insulating and thermally conductive sheet, the thermally conductive grease layer provided between at least one of (i) the electrically insulating and thermally conductive sheet and the heat generator and (ii) the electrically insulating and thermally conductive sheet and the heat dissipator;
   wherein the thermally conductive grease comprises one of (i) a dimethylsilicone-based composition, (ii) a perfluoropolyether-based composition, (iii) a $C_6$–$C_{20}$ alkyl-modified silicone-based composition, and (iv) a methylphenylsilicone-based composition; and the electrically insulating and thermally conductive sheet comprises a fluorosilicone-based rubber.

5. A heat dissipation assembly comprising:
   a) a heat generator;
   b) a heat dissipator integrated with the heat generator;
   c) an electrically insulating and thermally conductive sheet configured to integrate the heat generator and the heat dissipator; and
   d) a thermally conductive grease layer formed from a thermally conductive grease which is incompatible with the electrically insulating and thermally conductive sheet such that substance migration does not substantially occur between the thermally conductive grease layer and the electrically insulating and thermally conductive sheet, the thermally conductive grease layer provided between at least one of (i) the electrically insulating and thermally conductive sheet and the heat generator and (ii) the electrically insulating and thermally conductive sheet and the heat dissipator;
   wherein the thermally conductive grease includes a mixture of thermally conductive fillers having different particle sizes.

6. The heat dissipation assembly of claim 1, wherein the heat generator is a semiconductor device.

7. A heat dissipation assembly comprising:
   a) a heat generator;
   b) a heat dissipator integrated with the heat generator;
   c) an electrically insulating and thermally conductive sheet configured to integrate the heat generator and the heat dissipator; and
   d) a thermally conductive grease layer formed from a thermally conductive grease which is incompatible with the electrically insulating and thermally conductive sheet and is provided between at least one of (i) the electrically insulating and thermally conductive sheet and the heat generator and (ii) the electrically insulating and thermally conductive sheet and the heat dissipator;
   wherein a change weight of at least one of the (i) thermally conductive grease layer and (ii) electrically insulating and thermally conductive sheet due to substance migration between the thermally conductive grease layer and the electrically insulating and thermally conductive sheet is less than 10%.

8. The heat dissipation assembly of claim 1, wherein a change weight of at least one of the (i) thermally conductive grease layer and (ii) electrically insulating and thermally conductive sheet due to substance migration between the thermally conductive grease layer and the electrically insulating and thermally conductive sheet is less than 5%.

9. The heat dissipation assembly of claim 8, wherein a change weight of at least one of the (i) thermally conductive grease layer and (ii) electrically insulating and thermally conductive sheet due to substance migration between the thermally conductive grease layer and the electrically insulating and thermally conductive sheet is less than 2%.

10. The heat dissipation assembly of claim 8, wherein a change weight of at least one of the (i) thermally conductive grease layer and (ii) electrically insulating and thermally conductive sheet due to substance migration between the thermally conductive grease layer and the electrically insulating and thermally conductive sheet is less than 1%.

* * * * *